United States Patent [19]

Scholz

[11] 4,287,491

[45] Sep. 1, 1981

[54] CIRCUIT FOR SELECTIVELY OBTAINING AUTOMATIC DYNAMIC COMPRESSION OR EXPANSION

[75] Inventor: Werner Scholz, Gehrden, Fed. Rep. of Germany

[73] Assignee: Licentia Patent-Verwaltungs-GmbH, Frankfurt am Main, Fed. Rep. of Germany

[21] Appl. No.: 106,160

[22] Filed: Dec. 21, 1979

[30] Foreign Application Priority Data

Dec. 23, 1978 [DE] Fed. Rep. of Germany ....... 2856045

[51] Int. Cl.³ .................... H03H 11/36; H04B 1/64
[52] U.S. Cl. ...................................... 333/14; 330/126
[58] Field of Search .................. 333/14; 330/86, 126, 330/282; 455/72

[56] References Cited

U.S. PATENT DOCUMENTS 3,624,539  11/1971  Kao et al. ................... 330/126 X
4,114,115  9/1978   Minnis ......................... 330/86 X

OTHER PUBLICATIONS

Rothauser, *Speech Processing System,* IBM Technical Disclosure Bulletin, vol. 7, No. 11, Apr. 1965.

*Primary Examiner*—Paul L. Gensler
*Attorney, Agent, or Firm*—Spencer & Kaye

[57] ABSTRACT

A circuit for the selective automatic dynamic compression and expansion of a signal having frequency components within a given frequency spectrum. It comprises amplifier means having at least one input coupled to the input terminal of the circuit and a summing circuit having its output coupled to the output terminal of the circuit. A plurality of frequency selective channels, each capable of transmitting signals having frequencies within a predetermined portion of the frequency spectrum are coupled between the output of the amplifier means and the input of the summing circuit. One of the frequency selective channels is adapted for transmitting signals in the high frequency range of the frequency spectrum and consists of only a passive filter and an associated adjusting device. The remaining frequency selective channels each include a passive filter, an associated adjusting device and an impedance converter.

5 Claims, 1 Drawing Figure

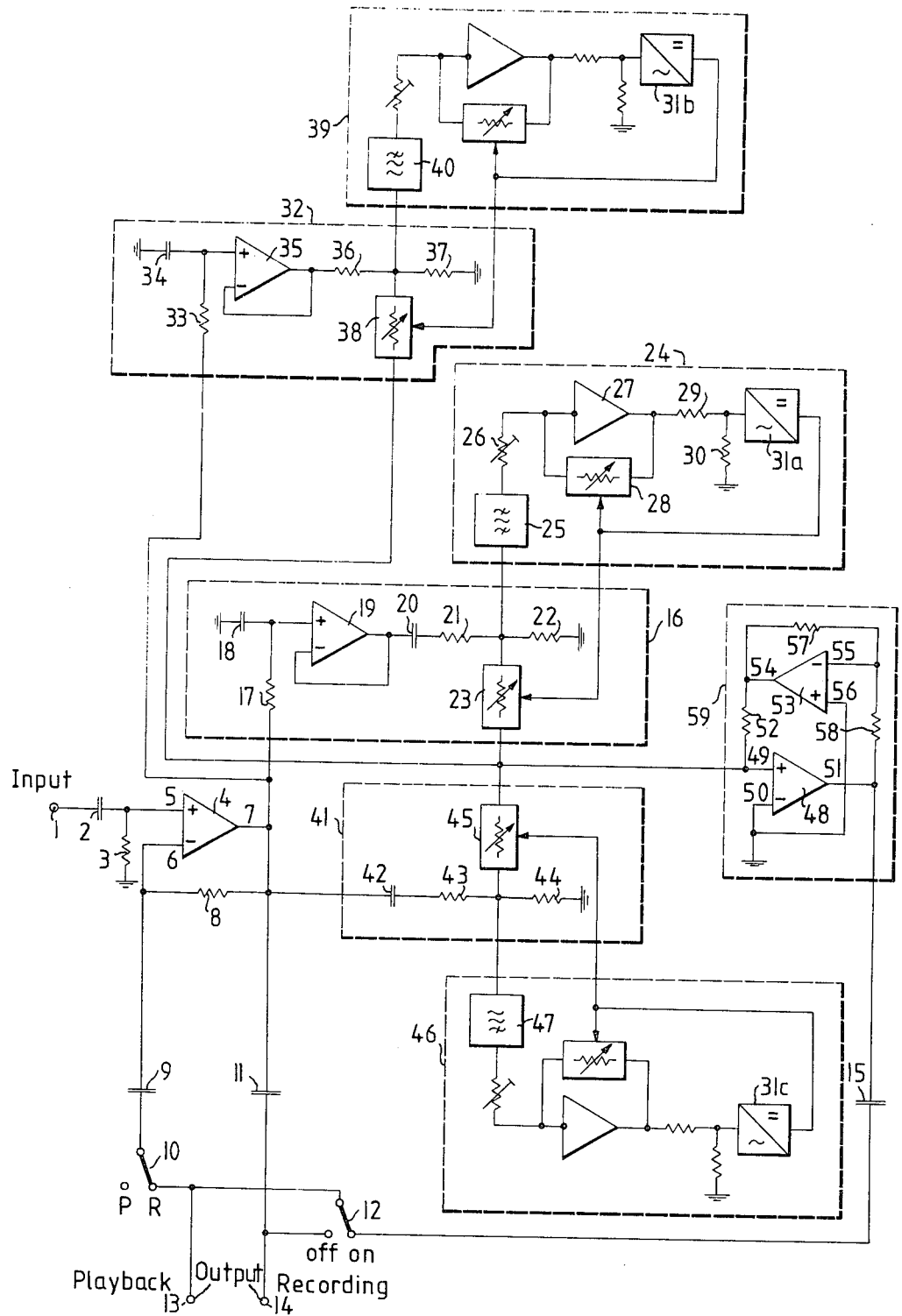

CIRCUIT FOR SELECTIVELY OBTAINING AUTOMATIC DYNAMIC COMPRESSION OR EXPANSION

BACKGROUND OF THE INVENTION

The present invention relates to a computer circuit for selectively obtaining automatic dynamic compression or expansion of an input signal.

Companders are used to improve the signal-to-noise ratio in the transmission of signals over transmission paths as well as for the storage of signals. In operation, the magnitude of relatively weak useful signals is amplified prior to transmission or storage more than that of relatively large magnitude signals and then lowered after transmission or playback. The noise signals, which are superimposed on the useful signals during transmission, are also lowered after transmission and can be suppressed to some degree by the useful signals. The suppression effect is a physiological phenomenon and depends on the amount of frequency deviation between the useful signal and the noise signal. It is therefore advisable to divide the low frequency spectrum into a plurality of frequency selective channels and to control the effective transmission factor in these channels as a function of only the useful signals being transmitted.

Complementary behavior for both compression and expansion can be obtained in a compander by using the same adjusting devices for both modes of operation. Specifically, the adjusting devices are connected in the feedback path of an amplifier for the compression mode of operation and in the signal path including the amplifier for the expansion mode of operation.

It has been found that in the operating mode employing feedback there is a tendency toward oscillation which is determined mainly by the transmission characteristics of the highest frequency channel. This tendency to oscillate occurs because the lowpass filters in the feedback path formed of the circuit and transistor capacitances produce a delay in the signals and therefore a shift in phase. If, for example, an amplifier is located in the feedback path so as to compensate for the high attenuation caused by the adjusting device, the critical phase shift required for resonance may be reached in the high frequency channel.

It is therefore an object of the present invention to provide a feedback path for the high frequency channel of a circuit for automatic dynamic compression or expansion which exhibits a short signal delay. Another object is to provide a circuit for automatic dynamic compression or expansion which does not require a differential amplifier in the high frequency channel.

SUMMARY OF THE INVENTION

The present invention provides a circuit for the selective automatic dynamic compression and expansion of a signal having frequency components within a given frequency spectrum. It comprises amplifier means having at least one input coupled to the input terminal of the circuit and a summing circuit having its output coupled to the output terminal of the circuit. A plurality of frequency selective channels, each capable of transmitting signals having frequencies within a predetermined portion of the frequency spectrum, are coupled between the output of the amplifier means and the input of the summing circuit. One of the frequency selective channels is adapted for transmitting signals in the high frequency range of the frequency spectrum and consists of only a passive filter and an associated adjusting device. The remaining frequency selective channels each include a passive filter, an associated adjusting device and an impedance converter.

BRIEF DESCRIPTION OF THE DRAWINGS

The drawing shows a compander circuit for the selective automatic dynamic compression or expansion of a signal in which the frequency spectrum is divided into three channels.

DESCRIPTION OF A PREFERRED EMBODIMENT

Referring to the drawing, the compander receives an input signal at an input terminal 1 and this signal is coupled by a capacitor 2 to the non-inverting input 5 of a differential amplifier 4. A resistor 3 connected between the non-inverting input 5 and ground determines the input resistance of the circuit.

A feedback path is coupled between the output 7 of the differential amplifier 4 and an inverting input 6 of this amplifier. During the compression mode of operation, the feedback path comprises a controllable filter 41 for the upper frequency band, a controllable filter 16 for the medium frequency band and a controllable filter 32 for the lower frequency band. The outputs of the controllable filters 41, 16 and 32 are connected to the input of a summing circuit 59 which functions as a non-inverting summing amplifier. The feedback path extends from the output of the summing circuit 59 via a capacitor 15, a first switch 12, a second switch 10 and a capacitor 9 to the inverting input 6 of the differential amplifier 4. The output of the summing circuit 59 has a low impedance and this results in a direct feedback path from the amplifier 4 through a resistor 8 being effectively bypassed, resistor 8 functioning only to set the operating point of the circuit.

The signal path extends from the output 7 of the differential amplifier 4 via a capacitor 11 to an output terminal 14. During the compression mode, the compressed useful signals are obtained at this output terminal. During the expansion mode, the switch 10 is switched to the playback position "P" and the feedback path of the differential amplifier 4 consists only of the connection from output 7 through the resistor 8 to the inverting input 6.

The circuit elements, which are included in the feedback path during the compression mode, are switched to the signal path during the expansion mode. The signal path during the expansion mode extends from the output 7 of the differential amplifier 4 through the controllable filters 41, 16 and 32 to the summing circuit 59. From the output of the summing circuit the signal path extends through the capacitor 15 and switch 12 to an output terminal 13. When switch 12 is placed in the "OFF" position, the compander is ineffective and the input signal present at input terminal 1 is transmitted with constant unity gain through differential amplifier 4 and capacitor 11 to the output terminals 13 and 14.

The effective transmission coefficient for each controllable filter is determined by a control circuit which includes a control voltage generator. For the high frequency channel a control circuit 46 is provided, for the medium frequency channel control circuit 24 is provided and for the low frequency channel a control circuit 39 is provided. The control circuits are of essentially the same configuration except for the weighting filters 47, 25 and 40 at their inputs and the time constants of rectifiers 31c, 31a and 31b respectively which provide the control voltage.

A signal which has had its dynamic gain already reduced is fed through weighting filter 25 and a trimming potentiometer 26 to the input of a controllable amplifier 27. The gain of this amplifier is controlled by a controllable resistor 28 in such a way that a signal applied at input terminal 1 is reduced at the input of the control circuit 16 in the quiescent state of the circuit to one half its dynamic value and at the output of the amplifier 27 to a dynamic value of zero. The output signal of the amplifier 27 is fed via a voltage divider comprising resistors 29 and 30 to a control voltage generator 31a. The control voltage generator 31a is connected to the control inputs of the controllable resistor 28 and to a controllable resistor 23 located in the controllable filter 16. The output of generator 31a controls resistors 23 and 28 to reduce their resistance with increasing useful signal amplitude.

The three controllable filter arrangements subdivide the frequency spectrum into three frequency bands, the frequency characteristic being preferably selected so that the gain-frequency curves of adjacent channels intersect at −3 dB. The channel for the highest frequency band 41 includes a highpass filter comprising a capacitor 42, a resistor 43 and a resistor 44. From the junction of resistors 43 and 44, the signal is coupled to the control circuit 46 and to a controllable resistor 45 which acts as an adjusting device. The controllable resistor 45 is connected at its other end to the input of the summing circuit 59. The voltage divider comprising resistors 43 and 44, which is used to match the magnitudes of the signals fed to the adjusting device, is included in the frequency determining highpass filter. The junction of the highpass filter with the controllable resistor 45 has such a low impedance that when the resistance of this resistor changes, the limit frequency of the highpass filter and thus of the high frequency transmission channel is substantially unaffected. Therefore, it is possible to operate without an impedance converter or isolation amplifier thereby retaining the short phase delay required to achieve stability for this filter whose effective transmission coefficient is controllable.

The controllable filter 16 for the medium frequency channel includes, at its input, a lowpass filter comprising a resistor 17 and a capacitor 18. A voltage follower 19, which acts as an isolator amplifier or impedance converter is connected to the lowpass filter. At the output of the impedance converter 19 there is located a highpass filter including a capacitor 20 and resistors 21 and 22. The highpass filter is similar to that used in the high frequency channel. Correspondingly, the junction of resistors 21 and 22 is connected to the control circuit 24 and to a controllable resistor 23 whose other terminal is connected to the input of the summing circuit 59. The effective transmission coefficient of the medium frequency channel decreases with increasing frequency. Thus, the higher gain generated by amplifier 19 under quiescent conditions, as compared to that of the high frequency channel, together with the additional phase shift caused by the circuit and transistor capacitances cannot lead to a critical phase shift. In the region of higher phase shifts of the lowpass filters located in the medium frequency channel, the feedback is taken over increasingly by the next higher channel. In the medium and low frequency ranges, the inclusion of an impedance converter has no adverse affect on the stability of the control loop.

The low frequency channel 32 includes a lowpass filter comprising a resistor 33 and a capacitor 34. An impedance converter 35, which serves as an isolation amplifier, is connected to the lowpass filter. At the output of the impedance converter there is connected a voltage divider comprising resistors 36 and 37. The junction of the resistors is connected to the control circuit 39 and to one terminal of a controllable resistor 38. The other terminal of the controllable resistor 38 is connected to the input of the summing circuit 59. As in the case of the medium frequency channel, the critical phase shift cannot be reached in the low frequency channel.

The summing circuit 59 is a non-inverting summing amplifier which compensates for the attenuation caused by the controllable filters and has a short phase delay. The input signals are fed to the non-inverting input 49 of a differential amplifier 48. The inverting input 50 of the differential amplifier is connected to a reference point at ground potential. From the output 51 of the differential amplifier 48, a feedback path leads through a resistor 58 to the inverting input 55 of a differential amplifier 53. The non-inverting input 56 of the differential amplifier 53 is connected to the reference point at ground potential. The output 54 of the differential amplifier 53 is connected, via a resistor 52, to the non-inverting input 49 of the differential amplifier 48. The differential amplifier 53 additionally includes a resistor 57 in the feedback path between its output 54 and its inverting input 55.

With high gain in the circuit, the feedback path of the amplifier 48 must have correspondingly high attenuation. The amplifier is then connected in such a manner that its gain is less than unity. Under the condition that the differential amplifiers 48 and 53 have the same characteristics, the amplifier 53 still operates, at the end of the transmission range of the summing circuit 59, as an almost ideal inverter. The transmission range of the summing circuit 59 is then determined, in the same manner as in a circuit having only one amplifier with voltage feedback connected as an inverting amplifier, by the amplifier located in the signal path, i.e., between the input and the output of the summing circuit 59. The circuit is thus the true counterpart to the prior art inverting circuit. Compared to a non-inverting amplifier having two inverting amplifiers connected in series wherein the quiescent gains of the individual amplifiers are multiplied and in which the lowpass filters formed of the circuit and transistor capacitances produce a steeper phase curve, the summing circuit 59 is more stable with the same amount of circuitry. The combination of the controllable filter for the high frequency channel in conjunction with the summing circuit reduces the tendency of the circuit to oscillate.

It is also possible, in addition to the subdivision of the frequency band into three ranges as described, to subdivide the band into a plurality of ranges. Additional controllable filters, as well as additional control circuits would then have to be provided. The additional controllable filters could then be designed in a manner similar to that of filter 16.

It is also possible to divide the frequency range into only two bands. In this case, one channel for the high frequency band for filter 41 and one channel for the low frequency band for filter 32 would suffice, the controllable filter 16 not being used. In the latter case, the limit frequencies of the bands would be adapted to correspond to the frequency overlap.

The frequency limitation of the total transmission range is effected outside the compander circuit. For example, the coupling capacitor 2 and the resistor 3 can be used to establish the lower frequency limit and an additional lowpass filter at the input can be used to set the upper frequency limit in such a manner that the transmission range of the compression circuit is no greater than the bandwidth of the transmission channel.

It will be understood that the above description of the present invention is susceptible to various modifications, changes and adaptations, and the same are intended to be comprehended within the meaning and range of equivalents of the appended claims.

What is claimed is:

1. A circuit, having an input terminal and first and second output terminals, for selectively compressing or expanding a signal having frequency components within a given frequency spectrum, comprising:

amplifier means having first and second inputs and an output, said first input being coupled to said input terminal and said output to said first output terminal;

a summing circuit having an input and an output, the output of said summing circuit being coupled to the second input of said amplifier means when said signal is being compressed and to said second output terminal when said signal is being expanded, the compressed signal being obtained at said first output terminal; and a plurality of frequency selective channels each capable of transmitting signals having frequencies within a predetermined portion of said frequency spectrum, coupled in parallel between the output of said amplifier means and the input of said summing circuit, one of said frequency selective channels being adapted for transmitting signals in the high frequency range of said frequency spectrum and consisting of only a passive filter and an associated variable impedance, the remaining frequency selective channels each including a passive filter, variable impedance and an impedance converter.

2. A circuit as defined in claim 1 wherein said plurality of frequency selective channels includes only said high frequency channel and a frequency selective channel for low frequencies.

3. A circuit as defined in claim 1 or 2 wherein said summing circuit comprises:

a first amplifier having a non-inverting input connected to the outputs of said frequency selective channels and an output coupled to said output terminal; and a second amplifier having an inverting input coupled to the output of said first amplifier and an output coupled to the non-inverting input of said first amplifier.

4. A circuit as defined in claim 3 which further includes switching means for coupling the output of said summing circuit to the second input of said amplifier means when said circuit is employed for signal compression and to said second output terminal when said circuit is employed for signal expansion.

5. A circuit as defined in claim 3 wherein each of said frequency selective channels comprises a controllable filter having an associated transmission coefficient and a control circuit for controlling said coefficient.

* * * * *